United States Patent [19]

Shimizu

[11] Patent Number: 5,229,667
[45] Date of Patent: Jul. 20, 1993

[54] DELAY UNIT IMPLEMENTED BY INVERTING CIRCUITS ASSOCIATED WITH CAPACITIVE LOAD FOR INCREASING DELAY

[75] Inventor: Norie Shimizu, Tokyo, Japan
[73] Assignee: NEC Corporation, Tokyo, Japan
[21] Appl. No.: 743,636
[22] Filed: Aug. 12, 1991

[30] Foreign Application Priority Data

Aug. 11, 1990 [JP] Japan .................. 2-213235

[51] Int. Cl.$^5$ .................. H03K 5/13; H01L 25/00
[52] U.S. Cl. .................. 307/605; 307/303.1; 307/303.2; 307/592; 307/594; 307/595; 257/369
[58] Field of Search .................. 307/303, 303.1, 303.2, 307/304, 590, 592, 594, 595, 605; 357/23.6, 42; 257/369

[56] References Cited

U.S. PATENT DOCUMENTS

| | | | |
|---|---|---|---|
| 3,134,026 | 5/1964 | Earle | 307/303 |
| 4,045,688 | 8/1977 | Stewart | 307/594 |
| 4,477,736 | 10/1984 | Onishi | 357/23.6 |
| 4,482,825 | 11/1984 | Nozaki et al. | 357/23.6 |
| 4,516,312 | 5/1985 | Tomita | 307/303.2 |
| 4,868,627 | 9/1989 | Yamada et al. | 307/585 |
| 5,097,159 | 3/1992 | Seki et al. | 307/594 |

FOREIGN PATENT DOCUMENTS

| | | | |
|---|---|---|---|
| 0076431 | 5/1984 | Japan | 357/23.6 |
| 0274355 | 12/1986 | Japan | 357/23.6 |
| 0286270 | 12/1987 | Japan | 357/23.6 |
| 0226111 | 9/1988 | Japan | 307/605 |

OTHER PUBLICATIONS

IBM Tech. Discl. Bult. vol. 27 #12 "CMOS Delay Circuit";, May, 1985; p. 7134.

Primary Examiner—William L. Sikes
Assistant Examiner—T. Cunningham
Attorney, Agent, or Firm—Sughrue, Mion, Zinn, Macpeak & Seas

[57] ABSTRACT

A delay unit incorporated in a standard cell type semicustom-made integrated circuit comprises a plurality of complementary inverting circuits coupled in cascade for introducing a time delay into propagation of a signal, and a lead circuit coupled to one of the complementary inverting circuits for increasing the time delay, and the plurality of complementary inverting circuits and the load circuit are formed in and one a plurality of rectangular active areas defined by a thick field oxide film grown on a major surface of a semiconductor substrate, wherein the thick field oxide film penetrates into two of the rectangular active areas so as to form respective bifurcated portions, one of the complementary inverting circuits and the load circuit being formed in the bifurcated portions so that large channel resistance of the complementary inverting circuit and large capacitance of the load circuit are easily produced without changing the arrangement of the rectangular active areas.

14 Claims, 4 Drawing Sheets

DELAY UNIT IMPLEMENTED BY INVERTING CIRCUITS ASSOCIATED WITH CAPACITIVE LOAD FOR INCREASING DELAY

FIELD OF THE INVENTION

This invention relates to a delay unit and, more particularly, to a delay unit incorporated in a semicustom-made integrated circuit.

DESCRIPTION OF THE RELATED ART

A typical example of the standard cell type semicustom-made integrated circuit is fabricated on a single semiconductor substrate 1, and the standard cell type semicustom-made integrated circuit includes a delay unit 2 as shown in FIG. 1. The delay unit 2 is implemented by a plurality of inverting circuits 21, 22, ... and 2n coupled in cascade as will be better seen from FIG. 2, and the inverting circuits 21 to 2n are of the complementary inverting circuit, i.e., a series combination of a p-channel enhancement type field effect transistor Qp and an n-channel enhancement type field effect transistor Qn coupled between a power voltage line Vcc and a ground voltage line GND. When an input signal IN is supplied to the first inverting circuit 21, the delay unit 2 propagates the input signal IN from stage to stage, and time delay is introduced in the propagation of the input signal IN. Finally, when the input signal IN reaches the final inverting circuit 2n, the delay unit 2 produces a delay signal OUT.

Turning back to FIG. 1, in the major surface of the semiconductor substrate 1 are selectively grown a thick field oxide film 1a which defines two rows of active areas 3a to 3c and 4a to 4c. In a standard cell type semicustom-made integrated circuit, it is preferable to regulate all of the channel widths in at least one function block to a predetermined value, because the active areas thus closely arranged minimizes dead space. For this reason, the active areas 3a to 3c and 4a to 4c are substantially uniform, and are regularly arranged in matrix. P-type impurity atoms are selectively doped into the active areas 3a to 3c so that p-type impurity regions 31a to 31g are produced therein. The active areas 4a to 4c are selectively doped with n-type impurity atoms, and the n-type impurity regions 41a to 41g take place in the active areas 4a to 4c. A thin gate oxide film is grown on that area between adjacent two impurity regions in every active area 3a to 3c and 4a to 4c, and polysilicon strips 5a, 5b, 5c and 5d extend over the thin gate oxide films, respectively. Each of the polysilicon strips 5a to 5d provides a common gate electrode of one of the inverting circuits 21 to 2n, and the input signal IN is applied to the polysilicon strip 5a.

Although an inter-level insulating film structure is provided on the major surface and the semiconductor substrate 1 and covers the polysilicon strips 5a to 5d, the inter-level insulating film structure is deleted from FIG. 1 for the sake of simplicity. The power voltage line Vcc and the ground voltage line GND extend in parallel through the inter-level insulating film structure, and are held in contact with p-type impurity regions 31b, 31e and 31f each located in a central portion of one of the active areas 3a to 3c and with the n-type impurity regions 41b, 41e and 41f each also located in a central portion of one of the active areas 4a to 4c. In order to allow the power voltage line Vcc and the ground voltage line GND to couple the p-type impurity regions 31b, 31e and 31f and the n-type impurity regions 41b, 41e and 41f, appropriate contact hole are formed in the inter-level insulating film structure, and the location of each contact hole is indicated by "X" in FIG. 1. T-shaped conductive strips 7a, 7b, 7c, 7d and 7e are further formed in the inter-level insulating film structure, and each of the T-shaped conductive strips 7a to 7e interconnects the p-type impurity region on either side of one of the active areas 3a to 3c, the n-type impurity region on the same side of one of the active areas 4a to 4c and one of the polysilicon strips 5b to 5d. Contact holes are formed at appropriate locations of the inter-level insulating film structure so as to allow the T-shaped conductive strips to couple the p-type impurity regions and the n-type impurity regions to the polysilicon strips. The locations of the contact holes are also indicated by "X".

The p-type impurity regions 31b, 31e and 31f at the central areas serve as the source regions of the p-channel enhancement type field effect transistors Qp, the p-type impurity regions 31a, 31c, 31d and 31g on both sides of the source regions provide the drain regions of the p-channel enhancement type field effect transistors Qp. Similarly, the n-type impurity regions 41b, 41e and 41f at the central areas serve as the source regions of the n-channel enhancement type field effect transistors Qn, and the n-channel type impurity regions 41a, 41c, 41d and 41g on both sides of the source regions provide the drain regions of the n-channel enhancement type field effect transistors Qn. Therefore, every adjacent two inverting circuits coupled in cascade such as 21 and, 22 are fabricated from the active area 3a, the active area 4a, the polysilicon strips 5a and 5b and the T-shaped conductive strip 7a.

A problem is encountered in the prior art delay unit 2 in that the number of the inverting circuits 21 to 2n are proportionally increased together with the delay time period, and a large amount of real estate of the semiconductor substrate 1 is consumed by the delay unit 2. This is because of the fact that each of the inverting circuits 21 to 2n merely introduce a small amount of time delay.

SUMMARY OF THE INVENTION

It is therefore an important object of the present invention to provide a delay unit which occupies a small amount of real estate on a semiconductor chip.

It is another important object of the present invention to provide a delay unit which is desirable for a semicustom-made integrated circuit.

To accomplish these objects, the present invention proposes to cause a thick field oxide film to penetrate into active areas for forming bifurcated portion where an inverting circuit with large channel resistance and a load means are fabricated.

In accordance with one aspect of the present invention, there is provided a delay unit fabricated on a semiconductor substrate having a plurality of first active areas of one conductivity type and a plurality of second active areas of the opposite conductivity type respectively paired with the plurality of first active areas so as to form a plurality of active pairs, comprising: a) at least one load means formed in and over a part of one of the plurality of first active areas and a part of one of the plurality of second active areas paired with the aforesaid one of the plurality of first active areas; and b) a plurality of complementary inverting circuits coupled in cascade, and having a first complementary inverting circuit supplied with an input signal and a final complementary inverting circuit producing a delayed signal, one of the plurality of complementary inverting circuits except for the final complementary inverting circuit being formed in and over the one of the plurality of active pairs together with the load means, the load means being coupled to another of the plurality of complementary inverting circuits except for the final complementary inverting circuit formed in said aforesaid one of the active pairs, the aforesaid one of the plurality of complementary inverting circuits being larger in channel resistance than the aforesaid another of the plurality of complementary inverting circuits.

In accordance with another aspect of the present invention, there is provided a semicustom-made integrated circuit fabricated on a semiconductor substrate and having a plurality of function blocks, a delay unit being fabricated in one of the function blocks having a plurality of generally rectangular first active areas of one conductivity type and a plurality of generally rectangular second active areas of the opposite conductivity type respectively paired with the plurality of first active areas so as to form a plurality of active pairs, the plurality of generally rectangular first active areas and the plurality of generally rectangular second active areas being defined by a thick field oxide film, the plurality of generally rectangular first and second active areas being approximately equal in width, the thick field oxide film penetrating into one of the plurality of generally rectangular first active areas and one of the plurality of generally rectangular second active areas paired with the aforesaid one of the plurality of generally rectangular first active areas so as to form respective bifurcated portions each having two projections therein, the delay unit comprising a) at least one load means formed in an over one of the projections of one of the bifurcated portions and in and over one of the projections of the other bifurcated portion, and b) a plurality of complementary inverting circuits coupled in cascade, and having a first complementary inverting circuit supplied with an input signal and a final complementary inverting circuit producing a delayed signal, one of the plurality of complementary inverting circuits except for the final complementary inverting circuit being formed in and over the other projections of the bifurcated portions, another of the plurality of complementary inverting circuits being formed in and over remaining portion of the aforesaid one of the generally rectangular first active areas and in and over remaining portion of the aforesaid one of the generally rectangular second active areas.

BRIEF DESCRIPTION OF THE DRAWINGS

The features and advantages of the delay unit according to the present invention will be more clearly understood from the following description taken in conjunction with the accompanying drawings in which.

DESCRIPTION OF THE PREFERRED EMBODIMENTS

First Embodiment

Figure 1:
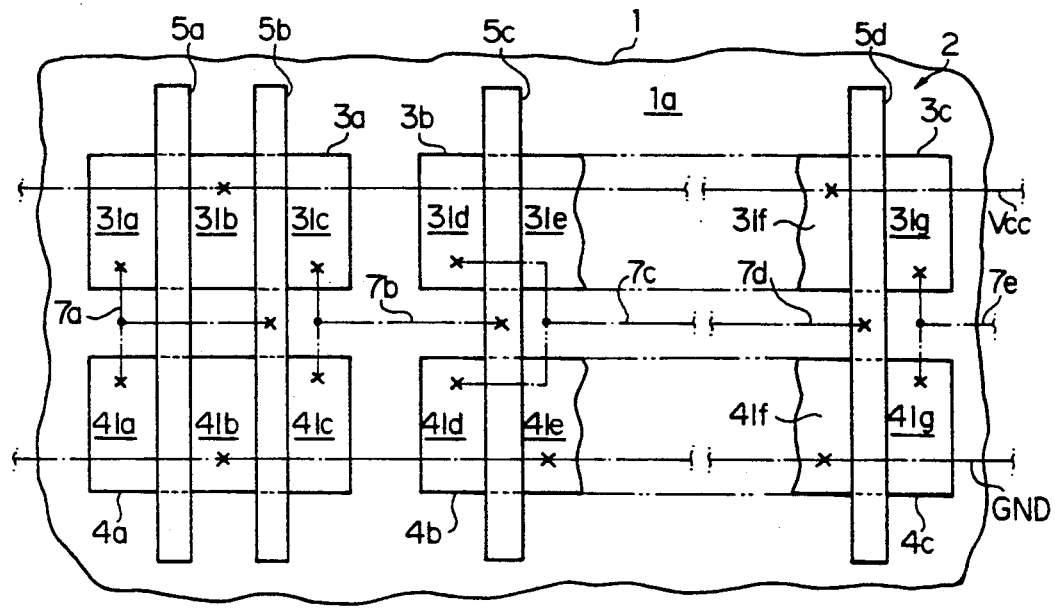
FIG. 1 is a plan view showing the layout of the prior art delay unit.
Figure 2:
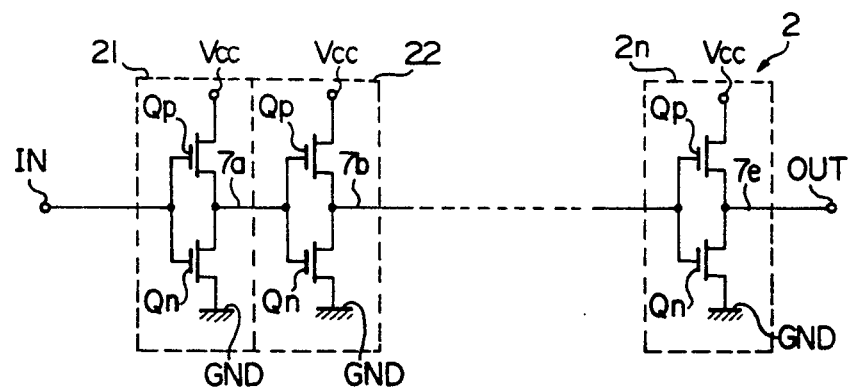
FIG. 2 is an equivalent circuit diagram showing the arrangement of the prior art delay unit.
Figure 3:
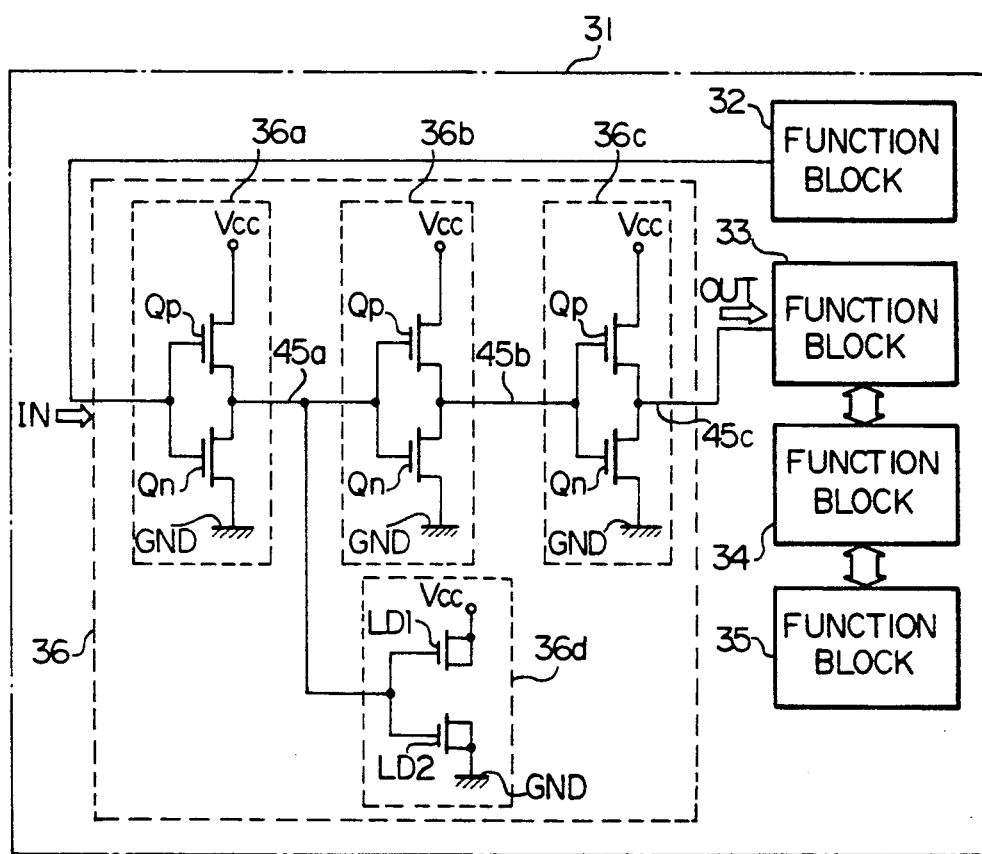
FIG. 3 is an equivalent circuit diagram showing the arrangement of a delay unit according to the present invention which is incorporated in a standard cell type semicustom-made integrated circuit.

Referring to FIG. 3, a standard cell type semicustom-made integrated circuit 31 comprises a plurality of function blocks 32, 33, 34, 35 and 36, and a delay unit embodying the present invention is formed in the function blocks 36. The delay unit is implemented by a plurality of complementary inverting circuits 36a, 36b and 36c as well as a capacitive load 36d. The complementary inverting circuits 36a to 36c are coupled in cascade, and provide a delay path to an input signal IN. Each of the complementary inverting circuits 36a to 36c is formed by a series combination of a p-channel enhancement type field effect transistor Qp and an n-channel enhancement type field effect transistor Qn coupled between a power source line Vcc and a ground voltage line GND. In this instance, the complementary inverting circuits 36a and 36c serve as the first and final stages of the delay path, and a delay signal OUT is supplied from the final stage of the delay path.

Figure 4:
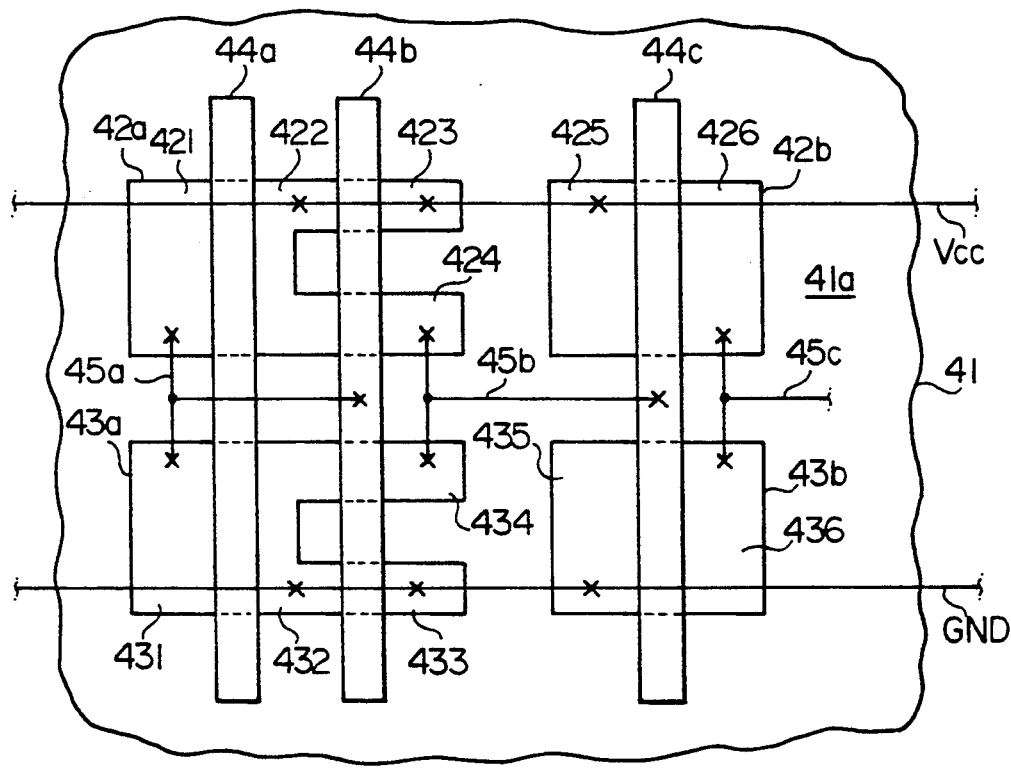
FIG. 4 is a plan view showing the layout of the delay unit shown in FIG. 3.

The layout of the delay unit embodying the present invention is illustrated in FIG. 4. The delay unit is fabricated on a semiconductor substrate 41 together with the other function blocks 32 to 35, and a thick field oxide film 41a is selectively grown on the major surface of the semiconductor substrate 41 for defining a plurality of active areas 42a, 42b, 43a and 43b. All of the active areas 42a to 43b have respective widths approximately equal to one another, and the active areas 42a and 42b and the active areas 43a and 43b form first and second rows, respectively. Thus, the active areas 42a to 43b thus arranged are closely packed in the function block 36, and minimizes dead space.

The active areas 42b and 43b are shaped into a rectangle. However, the thick field oxide film 41a penetrates into the active areas 42a and 43a so as to bifurcate the right portions of the active areas 42a and 43a, but the penetrations of the thick field oxide film 41a do not reach the left portions of the active areas 42a and 43a. The penetrations of the thick field oxide film are produced through a selective oxidation such as the localized oxidation of silicon process. P-type impurity atoms are selectively doped into the active areas 42a and 42b in the first row, and p-type impurity regions 421, 422, 423, 424, 425 and 426 are formed in the active areas 42a and 42b at spacings. Similarly, n-type impurity atoms are selectively doped into the active areas 43a and 43b, and n-type impurity regions 431, 432, 433, 434, 435 and 436 are formed in the active areas 43a and 43b at spacings. The active areas 42a and 42b and the active areas 43a and 43b serve as first active areas and second active areas, respectively.

Thin gate oxide films are grown on the active areas 42a and 42b between the p-type impurity regions 421 to 426, and the active areas 43a and 43b are partially covered with thin gate oxide films at between the n-type impurity regions 431 to 436. Polysilicon strips 44a, 44b and 44c extend over the thin gate oxide films, and each of the active areas 42a and 43a are divided into four sections with the polysilicon strips 44a and 44b. In this instance, all of the polysilicon strips 44a to 44c are equal in width to one another, and the polysilicon strips 44b and 44a serve as first and second conductive strips, respectively.

Although an inter-level insulating film structure is provided on the major surface of the semiconductor substrate 41, the inter-level insulating film structure is deleted from FIG. 4 for the sake of simplicity. In the inter-level insulating film structure, the power voltage line Vcc and the ground voltage line GND extend in parallel over said polysilicon strips 44a to 44c, and are isolated from the polysilicon strips 44a to 44c. The power voltage line Vcc is held in contact with the p-type impurity regions 421, 422, 423 and 425 through contact holes the locations of which are indicated by "X". The n-type impurity regions 432, 433 and 435 are coupled through contact holes to the ground voltage line GND, and the locations of the contact holes are also indicated by "X".

T-shaped conductive strips 45a, 45b and 45c are further formed in the inter-level insulating film structure, and each of the T-shaped conductive strips 45a to 45c interconnects the p-type impurity region serving as the drain node of one of the p-channel enhancement type field effect transistors Qp, the n-type impurity region serving as the drain node of one of the n-channel enhancement type field effect transistors Qn and the polysilicon strip providing the gate electrodes of the next stage. The T-shaped conductive strips 45a to 45c are isolated from the polysilicon strips 44a to 44c, however, contact holes indicated by "X" allow the T-shaped conductive strips 45a to 45c to couple the associated impurity regions to the polysilicon strips.

The p-type impurity regions 421 and 422, the gate oxide film therebetween and the polysilicon strip 44a form in combination the p-channel enhancement type field effect transistor Qp of the first stage, and the p-type impurity region 422 and 424, the gate oxide film therebetween and the polysilicon strip 44b as a whole constitute the p-channel enhancement type field effect transistor Qp of the second stage. Since the thick field oxide film 41a penetrates the right portion of the active area 42a, the p-channel enhancement type field effect transistor Qp of the second stage is smaller in gate width than the p-channel enhancement type field effect transistor Qp of the first stage. Similarly, the n-type impurity regions 431 and 432, the gate oxide film therebetween and the polysilicon strip 44a form in combination the n-channel enhancement type field effect transistor Qn of the first stage, and the n-type impurity region 432 and 434, the gate oxide film therebetween and the polysilicon strip 44b as a whole constitute the n-channel enhancement type field effect transistor Qn of the second stage. Since the thick field oxide film 41a penetrates the right portion of the active area 43a, the n-channel enhancement type field effect transistor Qn of the second stage is smaller in gate width than the n-channel enhancement type field effect transistor Qn of the first stage. The smaller the channel width is, the larger the channel resistance is. Therefore, the p-channel enhancement type field effect transistor Qp and the n-channel enhancement type field effect transistor Qn of the second stage allow the complementary inverting circuit 36b to introduce a larger amount of time delay rather than that of the prior art delay unit. The p-type impurity regions 425 and 426, the gate oxide film therebetween and the polysilicon strip 44c form in combination the p-channel enhancement type field effect transistor Qp of the final stage, and the n-type impurity regions 435 and 436, the gate oxide film therebetween and the polysilicon strip 44c as a whole constitute the n-channel enhancement field effect transistor Qn of the final stage. In this instance, the p-channel enhancement type field effect transistors Qp of the first and second stages respectively serve as third and first enhancement type transistors, and the n-channel enhancement type field effect transistors Qn of the first and second stages act as fourth and second enhancement type field effect transistors, respectively.

Since the p-type impurity regions 422 and 423 are electrically conducted to each other, the p-type impurity regions 422 and 423, the gate oxide film therebetween and the polysilicon strip 44b form a load transistor LD1 providing a capacitive load. The n-type impurity regions 432 and 433, the thin gate oxide film therebetween and the polysilicon strip 44b form another load transistor LD2 providing a capacitive load as similar to the load transistor LD1. The load transistors LD1 and LD2 are coupled to the complementary inverting circuit 36a of the first stage, and retard the propagation of the input signal IN. In this instance, the load transistors LD1 and LD2 serve as a load means. By virtue of the second inverting circuit 36b implemented by the component transistors with narrow channels as well as the load transistors LD1 and LD2 with large capacitance, the delay unit according to the present invention can introduce a large amount of time delay by using a smaller number of stages.

Second Embodiment

Figure 5:
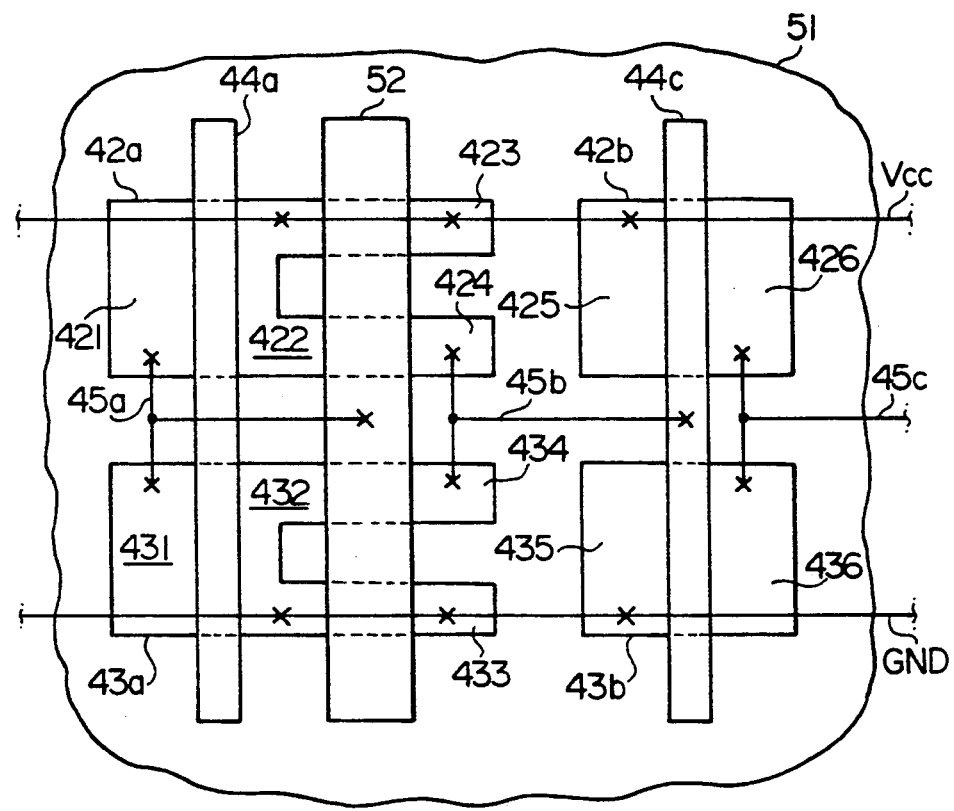
FIG. 5 is a plan view showing the layout of another delay unit according to the present invention.

Turning to FIG. 5 of the drawings, another delay unit embodying the present invention is fabricated on a semiconductor chip 51, and the structure of the second embodiment is similar to that of the first embodiment except for a polysilicon strip 52. For this reason, the regions and the strips forming parts of the second embodiment are designated by the same references denoting the corresponding regions and strips of the first embodiment without detailed description. The polysilicon strip 52 is larger in width than the other polysilicon strips 44a and 44c, and, accordingly, the load transistors corresponding to LD1 and LD2 provide respective larger capacitive loads. Therefore, the second embodiment achieves a larger amount of time delay than the first embodiment in so far as the number of stages is equal to the first embodiment.

As will be understood from the foregoing description, the delay unit according to the present invention retards propagation of an input signal without increase of the stages of the propagation path. Moreover, the load means is formed on a quarter of an active area without increasing the width thereof, and, for this reason, the dead space on the major surface is not increased even if the delay unit is employed in a semicustom-made integrated circuit.

Although particular embodiments of the present invention have been shown and described, it will be obvious to those skilled in the art that various changes and modifications may be made without departing from the spirit and scope of the present invention. For example, another delay unit may have more than three stages, and more than one stages may be associated with capacitive loads.

What is claimed is:

1. A semiconductor device provided with a delay unit fabricated on a semiconductor substrate having a plurality of first active areas of one conductivity type and a plurality of second active areas of the opposite conductivity type respectively paired with said plurality of first active areas so as to form a plurality of active pairs, comprising:

a) load circuit formed by a part of a first active area of one of said plurality of active pairs, a part of a second active area paired with said first active area and a predetermined polysilicon strip extending over said parts of said first and second active areas; and b) a plurality of complementary inverting circuits formed by additional polysilicon strips, active pairs selected from said plurality of active pairs and said predetermined polysilicon strip, other part of said first active area and other part of said second active area, and coupled in cascade, said plurality of complementary inverting circuits for producing a delayed signal in cooperation with said load circuit, said plurality of complementary inverting circuits having a first complementary inverting circuit supplied with an input signal and a final complementary inverting circuit outputting said delayed signal, one of said plurality of complementary inverting circuits except for said final complementary inverting circuit being formed by said other part of said first active area, said other part of said second active area and said predetermined polysilicon strip, said load circuit being coupled to an output node of another of said plurality of complementary inverting circuits except for said final complementary inverting circuit, said one of said plurality of complementary inverting circuits being larger in channel resistance than said another of said plurality of complementary inverting circuits.

2. A delay unit as set forth in claim 1, in which said plurality of first active areas and said plurality of second active areas are shaped into a generally rectangular configuration, and have reactive widths approximately equal to one another.

3. A delay unit as set forth in claim 2 in which said plurality of first active means and said plurality of second active areas are defined by a thick field oxide film, said thick field oxide film penetrating into said one of said plurality of first active areas and said one of said plurality of second active areas so that bifurcated portions each having two projections are formed therein, said load circuit being formed in association with one of the projections of one of said bifurcated portions and with one of the projections of the other bifurcated portion, said one of said plurality of complementary inverting circuits except for said final complementary inverting circuit being formed in association with the other projections of said respective bifurcated portions, said another of said plurality of complementary inverting circuits being formed in association with a remaining portion of said one of said plurality of first active areas and with a remaining portion of said one of said plurality of second active areas, said remaining portions being wider than said projections.

4. A delay unit as set forth in claim 3, in which said load circuit comprises load transistors each having said one of said projections of a respective bifurcated potion, a first insulating film covering a part of said one of said projections and a predetermined polysilicon strip passing over said first insulating film, parts of said one of said projections on both sides of said part beneath said first insulating film being electrically connected to each other.

5. A delay unit as set forth in claim 4, in which said one of said plurality of complementary inverting circuits except for said final complementary inverting circuit comprises a series combination of a first enhancement type field effect transistor and a second enhancement type field effect transistor opposite in channel conductivity type, said first enhancement type field effect transistor having a second insulating film covering a part of one of said other projections, source and drain regions formed in parts of said one of said other projections on both sides of said part beneath said second insulating film, and said predetermined polysilicon strip passing over said second insulating film, said second enhancement type field effect transistor having a third insulating film covering a part of the other of said other projections, source and drain regions formed in parts of said other of said other projections on both sides of said part beneath said third insulating film, and said predetermined polysilicon strip passing over said third insulating film.

6. A delay unit as set forth in claim 5, in which said another of said plurality of complementary inverting circuits comprises a series combination of a third enhancement type field effect transistor and a fourth enhancement type field effect transistor opposite in channel conductivity type, said third enhancement type transistor having a fourth insulating film covering a part of said remaining portion of said one of said plurality of first active areas, source and drain regions formed in parts of said remaining portion on both sides of said part beneath said forth insulating film, and a one of said additional polysilicon strips passing over said fourth insulating film, said fourth enhancement type transistor having a fifth insulating film covering a part of said remaining portion of said one of said plurality of second active areas, source and drain regions formed in parts of said remaining portion on both sides of said part beneath said fifth insulating film, and said one of said additional polysilicon strips passing over said fifth insulating film, said third and fourth enhancement type transistors being larger in channel width than said first and second enhancement transistors.

7. A delay unit as set forth in claim 6, in which said first conductive strip is approximately equal in width to said second conductive strip.

8. A delay unit as set forth in claim 6, in which said first conductive strip is larger in width than said second conductive strip.

9. A semicustom-made integrated circuit fabricated on a semiconductor substrate and having a plurality of function blocks, delay unit being formed in one of said function blocks having a plurality of generally rectangular first active areas of one conductivity type and a plurality of generally rectangular second active areas of the opposite conductivity type respectively paired with said plurality of first active areas so as to form a plurality of active paris, said plurality of generally rectangular first active areas and said plurality of generally rectangular second active areas being defined by a thick field oxide film, said plurality of generally rectangular first and second active areas being approximately equal in width, said thick field oxide film penetrating from a side edge of one of said plurality of generally rectangular first active areas into said one of said plurality of generally rectangular first active areas and from a side edge of one of said plurality of generally rectangular second active areas paired with said one of said plurality of generally rectangular first active areas into said one of said plurality of generally rectangular second active areas so as to form first bifurcated portions in said one of said plurality of generally rectangular first active areas and second bifurcated portions in said one of said plurality of generally rectangular second active areas, respectively, said delay unit comprising:
- a) load circuit formed by one of said first bifurcated portions, one of said second bifurcated portions and a predetermined polysilicon strip extending over said one of said first bifurcated portions and said one of said second bifurcated portions, and
- b) a plurality of complementary inverting circuits formed by others of said plurality of generally rectangular first active areas, others of said plurality of generally rectangular second active areas, additional polysilicon strips, said predetermined polysilicon strip, the other of said first bifurcated portions and the other of said second bifurcated portions, and coupled in cascade for producing a delayed signal in cooperation with said load circuit, said plurality of complementary inverting circuits having a first complementary inverting circuit supplied with an input signal and a final complementary inverting circuit outputting said delayed signal, one of said plurality of complementary inverting circuits except for said final complementary inverting circuit being formed by said other of said first bifurcated portions and with said other of said second bifurcated portions and said predetermined polysilicon strip, another of said plurality of complementary inverting circuits being formed of another of said plurality of generally rectangular first active areas, another of said one of said generally rectangular second active areas and one of said additional polysilicon strips, said one of said plurality of inverting circuits being larger in channel resistance than said another of said plurality of complementary inverting circuits.

10. A semicustom-made integrated circuit as set forth in claim 9, in which said load circuit comprises load transistors each formed of said one of said first bifurcated portions, a first insulating film covering a part of said one of said first bifurcated portions and a predetermined polysilicon strip passing over said first insulating film, parts of said one of said first bifurcated portions on both sides of said part beneath said first insulating film being electrically connected to each other.

11. A semicustom-made integrated circuit as set forth in claim 10, in which said one of said plurality of complementary inverting circuits except for said final complementary inverting circuit comprises a series combination of a first enhancement type field effect transistor and a second enhancement type field effect transistor opposite in channel conductivity type, said first enhancement type field effect transistor having a second insulating film covering a part of the other of said first bifurcated portions, source and drain regions formed in parts of said other of said first bifurcated portions on both sides of said part beneath said second insulating film, and said predetermined polysilicon strip passing over said second insulating film, said second enhancement type field effect transistor having a third insulating film covering a part of the other of said second bifurcated portions, source and drain regions formed in parts of said second bifurcated portions on both sides of said part beneath said third insulating film, and said predetermined polysilicon strip passing over said third insulating film.

12. A semicustom-made integrated circuit as set forth in claim 11, in which said another of said plurality of complementary inverting circuits comprises a series combination of a third enhancement type field effect transistor and a fourth enhancement type field effect transistor opposite in channel conductivity type, said third enhancement type transistor having a fourth insulating film covering a part of said remaining portion of said one of said plurality of first active areas, source and drain regions formed in parts of said remaining portion on both sides of said part beneath said forth insulating film, and a one of said additional polysilicon strips passing over said fourth insulating film, said fourth enhancement type transistor having a fifth insulating film covering a part of said remaining portion of said one of said plurality of second active areas, source and drain regions formed in parts of said remaining portion on both sides of said part beneath said fifth insulating film, and said one of said additional polysilicon strips passing over said fifth insulating film, said third and fourth enhancement type transistors being larger in channel width than said first and second enhancement transistors.

13. A semicustom-made integrated circuit as set forth in claim 12, in which said first conductive strip is approximately equal in width to said second conductive strip.

14. A semicustom-made integrated circuit as set forth in claim 12, in which said first conductive strip is larger in width than said second conductive strip.

* * * * *